United States Patent
Chen et al.

[11] Patent Number: 6,130,155
[45] Date of Patent: Oct. 10, 2000

[54] METHOD OF FORMING METAL LINES IN AN INTEGRATED CIRCUIT HAVING REDUCED REACTION WITH AN ANTI-REFLECTION COATING

[75] Inventors: Jeng-Pei Chen; Chung-Yi Chiu; Chang Hsun Lee, all of Hsin-Chu, Taiwan

[73] Assignees: ProMOS Technologies, Inc.; Mosel Vitelic, Inc., both of Hsinchu, Taiwan; Infineon AG, Germany

[21] Appl. No.: 09/347,171

[22] Filed: Jul. 2, 1999

[51] Int. Cl.[7] ............................................. H01L 21/4763
[52] U.S. Cl. ...................... 438/635; 438/636; 438/643; 438/648; 438/653; 438/656; 438/658; 438/660; 438/669; 438/671; 438/722; 438/785
[58] Field of Search .................... 438/635, 636, 438/643, 648, 653, 656, 658, 660, 663, 669, 671, 677, 685, 722, 785

[56] References Cited

U.S. PATENT DOCUMENTS

| | | | |
|---|---|---|---|
| 4,976,839 | 12/1990 | Inoue | 204/192.17 |
| 5,236,868 | 8/1993 | Nulman | 438/653 |
| 5,508,881 | 4/1996 | Stevens | 257/532 |
| 5,685,960 | 11/1997 | Fu et al. | 204/192.3 |
| 5,686,151 | 11/1997 | Imai et al. | 427/576 |
| 5,804,088 | 9/1998 | McKee | 216/47 |
| 5,838,530 | 11/1998 | Zhang | 361/321.4 |
| 5,851,364 | 12/1998 | Fu et al. | 438/653 |
| 5,858,184 | 1/1999 | Fu et al. | 438/685 |
| 5,858,621 | 1/1999 | Yu et al. | 430/313 |
| 5,926,730 | 7/1999 | Hu et al. | 438/656 |
| 5,942,319 | 8/1999 | Oyama et al. | 428/216 |
| 5,950,107 | 9/1999 | Huff et al. | 438/656 |
| 5,972,178 | 10/1999 | Narasimhan et al. | 204/192.17 |
| 5,976,769 | 11/1999 | Chapman | 430/316 |
| 6,007,684 | 12/1999 | Fu et al. | 438/648 |
| 6,020,024 | 2/2000 | Maiti et al. | 427/248.1 |
| 6,043,163 | 3/2000 | Tsai et al. | 438/720 |

Primary Examiner—John F. Niebling
Assistant Examiner—Lynne Gurley
Attorney, Agent, or Firm—Blakely, Sokoloff, Taylor & Zafman LLP

[57] ABSTRACT

A method of forming metal lines is disclosed. The method comprises the steps of: forming a composite metal layer over a wafer, the composite metal layer having a top layer of titanium/titanium nitride; oxidizing the top layer of titanium/titanium nitride to form a layer of titanium oxide; and patterning and etching the composite metal layer to form the metal lines.

4 Claims, 2 Drawing Sheets

METHOD OF FORMING METAL LINES IN AN INTEGRATED CIRCUIT HAVING REDUCED REACTION WITH AN ANTI-REFLECTION COATING

TECHNICAL FIELD OF THE INVENTION

The present invention relates to semiconductor fabrication, and more particularly, to a method of preventing an organic anti-reflection coating (ARC) from reacting with metal interconnects during manufacturing.

BACKGROUND OF THE INVENTION

In semiconductor integrated circuit (IC) fabrication, metal lines are deposited to interconnect IC components and to connect IC components to pads. The metal lines are formed by physical deposition (such as by sputtering) of a layer of metal (such as aluminum or an aluminum-copper alloy). Photoresist is applied to the metal layer to define a pattern for forming lines that interconnect the desired components of the IC. One common apparatus used for such etching is the Applied Materials MxP Centura.

The "metal layer" is typically not just a layer of aluminum or aluminum-copper alloy, but rather more typically is a composite stack of different layers. FIG. 1 shows such as prior art composite metal layer. The metal layer 101 comprises a bottom titanium/titanium nitride layer 103, an aluminum or copper layer 105, and a top titanium/titanium nitride layer 107. The purpose of the titanium/titanium nitride layers 103 and 107 are to act as both an adhesion layer and a diffusion barrier layer.

The use of this composite metal stack 101 is currently common practice in the semiconductor industry. As the widths of the metal lines decrease, the demands of the photolithography process require the use of an anti-reflection coating (ARC). It has been found however that the ARC, particularly organic ARC's, react adversely with the titanium/titanium nitride layer 107 to form micro masks that affect the metal etching. This may lead to yield problems such as metal line shorting.

Thus, what is needed is a method of preventing the organic ARC's from reacting with the titanium/titanium nitride layer 107.

SUMMARY OF THE INVENTION

A method of forming metal lines is disclosed. The method comprises the steps of: forming a composite metal layer over a wafer, said composite metal layer having a top layer of titanium/titanium nitride; oxidizing said top layer of titanium/titanium nitride to form a layer of titanium oxide over said top layer of titanium/titanium nitride; and patterning and etching said composite metal layer to form said metal lines.

DESCRIPTION OF THE PREFERRED EMBODIMENT

Figure 1:
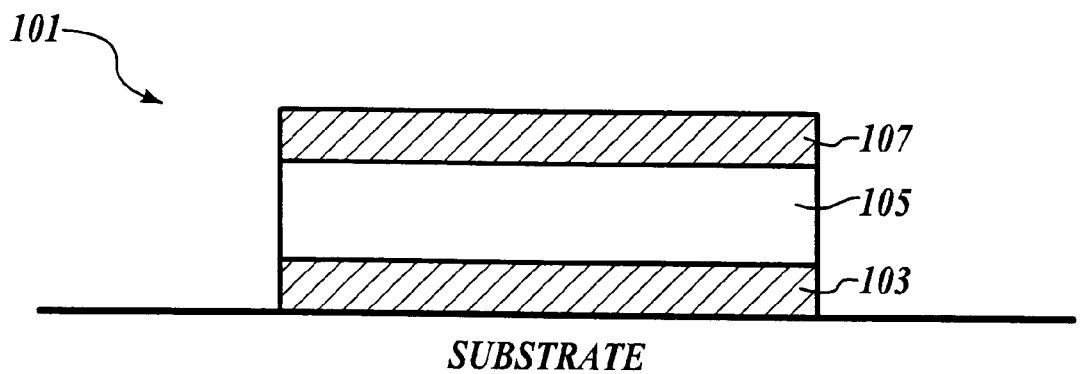
FIG. 1 is a cross-section view showing a metal line stack in accordance with the prior art.
Figure 2:
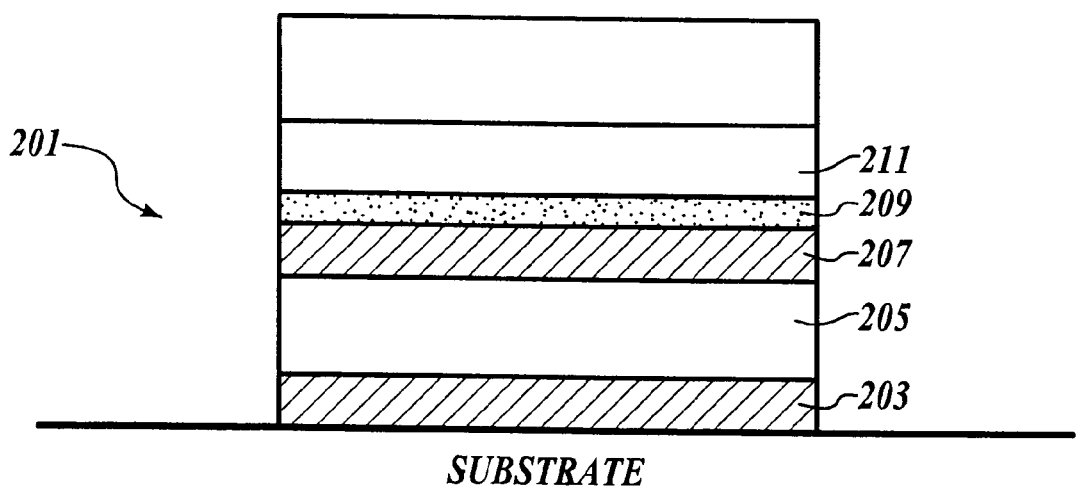
FIG. 2 is a cross-section view a metal stack formed in accordance with the present invention.

Turning to FIG. 2, a metal stack 201 formed in accordance with the present invention is shown. The stack 201 includes a titanium/titanium nitride layer 203 formed on the substrate. Typically, the titanium/titanium nitride layer 203 is formed by depositing a titanium layer to a thickness of about 100 angstroms. This is followed by a layer of titanium nitride to a thickness of less than 500 angstroms. Typically, the substrate is either an interlayer or intermetal dielectric formed from some form of silicon dioxide, i.e., TEOS, BPSG, SOG, etc. . . . Formed atop of the titanium/titanium nitride layer 203 is a conductive layer 205, such as aluminum, copper, or an aluminumcopper alloy. Formed atop of the conductive layer 205 is a top titanium/titanium nitride layer 207. The foregoing components of the metal stack 201 are the same as the prior art shown in FIG. 1.

Figure 3:
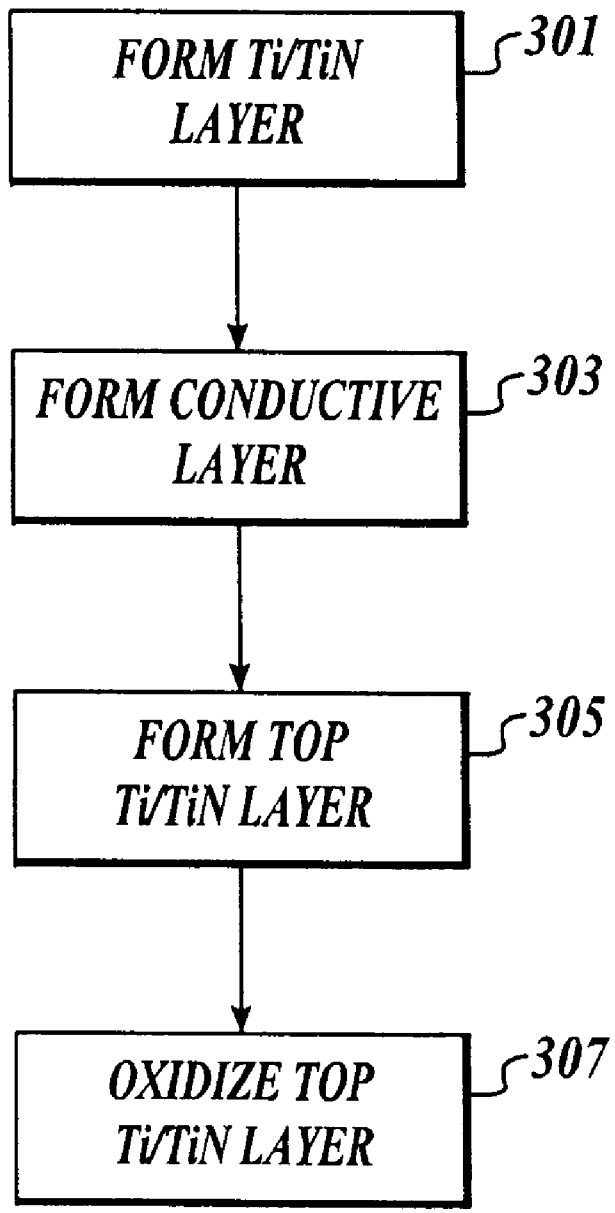
FIG. 3 is a flow diagram showing the steps of forming metal lines in accordance with the present invention.

In accordance with the present invention, an additional step is provided which forms a titanium oxide layer 209 atop of the top titanium/titanium nitride layer 207. Specifically, turning to FIG. 3, in step 301, the bottom titanium/titanium nitride layer 203 is formed. In step 303, the conductive layer 205 is formed atop of the titanium/titanium nitride layer 203. In step 305, the top titanium/titanium nitride layer 207 is formed atop of the conductive layer 205.

Finally, at step 307, a titanium oxide layer 209 is formed by oxidizing the top titanium/titanium nitride layer 207. The oxidation process is preferably done using an oxygen ($O_2$) plasma. Preferably, the oxidation process has the following parameters: pressure of 1250 millitorr, temperature of 220° C., $O_2$ flow rate of 2200 sccm, and a power of 1000 W for 120 seconds. However, it can be appreciated that the the recipe may be changed significantly to suit different oxidation apparatus and environments. The main point is that the titanium oxide layer be formed. Preferably, the titanium oxide layer should be less than 100 angstroms thick. Indeed, other methods of forming the titanium oxide layer 209, such as chemical vapor deposition (CVD) may be used.

The titanium oxide layer 209 completely covers the top titanium/titanium nitride layer 207 and serves to prevent contact with the anti-reflection coating 211. Therefore, reaction with the anti-reflection coating 211 is prevented. The present is particularly advantageous when used in conjunction with organic ARCs, such as the commercially available bottom anti-reflection coating (BARC) sold under the product name"Barl" manufactured by Shieply. While other types of barrier layers may be used to prevent the reaction with the titanium/titanium nitride layer 207 with the anti-reflection coating 211, the formation of the titanium oxide layer 209 is much simpler with merely the use of oxygen plasma in the preferred embodiment.

Although specific embodiments including the preferred embodiment have been illustrated and described, it will be obvious to those skilled in the art that various modifications may be made without departing from the spirit and scope of the present invention, which is intended to be limited solely by the appended claims.

What is claimed is:

1. A method of forming metal lines comprising the steps of:

forming a composite metal layer over a wafer, said composite metal layer having a top layer of titanium/titanium nitride;

oxidizing said top layer of titanium/titanium nitride to form a layer of titanium oxide over said top layer of titanium/titanium nitride; and after said top layer of titanium/titanium nitride has been oxidized, patterning and etching said composite metal layer to form said metal lines.

2. The method of claim 1 wherein said step of patterning and etching comprises:

depositing an organic anti-reflection coating onto said composite metal layer;

depositing a photoresist layer on said organic anti-reflection coating;

defining and developing a pattern onto said photoresist layer and said organic anti-reflection coating;

etching said composite metal layer to form said metal lines using said photoresist layer as an etching mask; and removing said photoresist layer and said organic anti-reflection coating.

3. The method of claim 1, wherein said oxidizing step is performed using thermal oxidation in an oxygen plasma.

4. The method of claim 2, wherein said oxidizing step is performed using thermal oxidation in an oxygen plasma.

* * * * *